United States Patent
Cai et al.

(10) Patent No.: US 11,774,513 B1
(45) Date of Patent: Oct. 3, 2023

(54) METHOD FOR PREDICTING LIFE, ELECTRICITY-CONSUMPTION DEVICE, AND STORAGE MEDIUM

(71) Applicants: Shenzhen Hairun New Energy Technology Co., Ltd., Guangdong (CN); Xiamen Hithium Energy Storage Technology Co., Ltd., Fujian (CN)

(72) Inventors: Xiang Cai, Guangdong (CN); Changfeng Wu, Guangdong (CN)

(73) Assignees: Shenzhen Hairun New Energy Technology Co., Ltd., Guangdong (CN); Xiamen Hithium Energy Storage Technology Co., Ltd., Fujian (CN)

(*) Notice: Subject to any disclaimer, the term of this patent is extended or adjusted under 35 U.S.C. 154(b) by 0 days.

(21) Appl. No.: 18/184,706

(22) Filed: Mar. 16, 2023

(30) Foreign Application Priority Data

Dec. 9, 2022 (CN) .......................... 202211576245.X

(51) Int. Cl.
  *G01R 31/392* (2019.01)
  *G01R 31/396* (2019.01)
(52) U.S. Cl.
  CPC ......... *G01R 31/392* (2019.01); *G01R 31/396* (2019.01)
(58) Field of Classification Search
  CPC ...... G01R 31/392; G01R 31/396; Y02E 60/10
  USPC .......................................................... 702/63
  See application file for complete search history.

(56) References Cited

U.S. PATENT DOCUMENTS

| 9,360,531 | B2* | 6/2016 | Suh ..................... G01R 31/367 |
| 11,527,786 | B1* | 12/2022 | Budan ................ G01R 31/3842 |
| 2022/0099753 | A1* | 3/2022 | Liu ...................... G01R 31/367 |

FOREIGN PATENT DOCUMENTS

CN       110442941 A   * 11/2019   ............. B60L 58/12

OTHER PUBLICATIONS

Yuan et al., CN 114371407 A, "Battery Capacity Forecasting Method And Device", Date Published: Apr. 19, 2022 (Year: 2022).*
CNIPA, Notification to Grant Patent Right for Invention for Chinese Patent Application No. 202211576245.X, dated Feb. 3, 2023, 3 pages.

* cited by examiner

*Primary Examiner* — John H Le
(74) *Attorney, Agent, or Firm* — IP Spring

(57) ABSTRACT

A method for predicting a life includes the following. Obtain multiple cycle numbers of a battery and multiple capacity data corresponding to the cycle numbers. Obtain multiple sets of first fitting data by fitting the cycle numbers and the capacity data with a bi-exponential empirical model. Obtain multiple sets of second fitting data by fitting the cycle numbers and the capacity data with a box-cox transformation method. Determine a first capacity error according to the multiple sets of first fitting data and the multiple capacity data. Determine a second capacity error according to the multiple sets of second fitting data and the capacity data. Generate a battery-life prediction model according to the first capacity error, the second capacity error, the multiple sets of first fitting data, and the multiple sets of second fitting data. Determine an RUL of the battery according to a predetermined battery-capacity-value and the battery-life prediction model.

20 Claims, 5 Drawing Sheets

CYCLE NUMBERS OBTAINED=10000, CYCLE-NUMBER ERROR=36

METHOD FOR PREDICTING LIFE, ELECTRICITY-CONSUMPTION DEVICE, AND STORAGE MEDIUM

CROSS-REFERENCE TO RELATED APPLICATION(S)

This application claims priority under 35 U.S.C. § 119(a) to and the benefit of Chinese Patent Application No. 202211576245.X, filed Dec. 9, 2022, the entire disclosure of which is hereby incorporated by reference.

TECHNICAL FIELD

This disclosure relates to the field of energy-storage battery technology, and in particular, to a method for predicting a life of a battery, an electricity-consumption device, and a computer-readable storage medium.

BACKGROUND

In actual application of energy-storage batteries, the capacity of the energy-storage battery may decrease with the increase of the number of charge and discharge cycles, and thus the performance of the energy-storage battery gradually deteriorates, and the energy-storage battery may have a battery-life failure problem, which may cause safety accidents. Therefore, prediction of a remaining useful life (RUL) of the energy-storage battery is particularly important. The RUL of the energy-storage battery refers to the number of charge and discharge cycles of the energy-storage battery in a time period from the current time to a time point at which the output power of the energy-storage battery cannot satisfy normal operation of a machine or a device, i.e., from the current time to a time point at which the energy-storage battery reaches a failure threshold. However, since the energy-storage battery has a relatively long useful life, capacity values and cycle numbers no longer approach a linear relationship in a case where cycle numbers are relatively large, as a result, it cannot be ensured that the RUL of the energy-storage battery with a long life can be predicated accurately.

SUMMARY

A method for predicting a life of a battery, a battery management system, an electricity-consumption device, and a storage medium are provided in the disclosure, which are used to solve at least one problem that a remaining useful life (RUL) of an energy-storage battery with a long life cannot be predicted accurately.

In a first aspect, a method for predicting a life of a battery is provided in the disclosure. The method for predicting a life includes the following. Obtain multiple cycle numbers of the battery and multiple capacity data corresponding to the multiple cycle numbers, where the multiple cycle numbers are multiple cycle numbers of the battery at multiple time nodes in a previous time period. Obtain multiple sets of first fitting data by fitting the multiple cycle numbers and the multiple capacity data with a bi-exponential empirical model. Obtain multiple sets of second fitting data by fitting the multiple cycle numbers and the multiple capacity data with a box-cox transformation method. Determine a first capacity error corresponding to the multiple cycle numbers according to the multiple sets of first fitting data and the multiple capacity data. Determine a second capacity error corresponding to the multiple cycle numbers according to the multiple sets of second fitting data and the multiple capacity data. Generate a battery-life prediction model according to the first capacity error, the second capacity error, the multiple sets of first fitting data, and the multiple sets of second fitting data. Determine an RUL of the battery according to a predetermined battery-capacity-value and the battery-life prediction model.

In a possible implementation, each of the multiple sets of first fitting data includes a first fitting-capacity-value, where according to the multiple sets of first fitting data and the multiple capacity data, determine the first capacity error corresponding to the multiple cycle numbers as follows. Calculate a first difference value between each first fitting-capacity-value and each capacity data that correspond to each of the multiple cycle numbers to obtain multiple first difference values. Obtain a sum of squares of the first difference values corresponding to the multiple cycle numbers by summing the squares of the first difference values. Obtain the first capacity error by extracting a square root of the sum of the squares of the first difference values.

It can be seen that, the first capacity error between the multiple first fitting-capacity-values and the multiple capacity data is calculated, and effect of the first capacity error on battery life prediction is analyzed to avoid a too large error between a predicted result output by the battery-life prediction model and an actual result, thereby improving RUL prediction accuracy.

In a possible implementation, each of the multiple sets of second fitting data includes a second fitting-capacity-value, where according to the multiple sets of second fitting data and the multiple capacity data, determine the second capacity error corresponding to the multiple cycle numbers as follows. Calculate a second difference value between each second fitting-capacity-value and each capacity data that correspond to each of the multiple cycle numbers to obtain multiple second difference values. Obtain a sum of squares of the second difference values corresponding to the multiple cycle numbers by summing the squares of the second difference values. Obtain the second capacity error by extracting a square root of the sum of the squares of the second difference values.

It can be seen that, the second capacity error between the multiple second fitting-capacity-values and the multiple capacity data is calculated, and effect of the first capacity error and the second capacity error on battery life prediction is comprehensively analyzed to avoid a too large error between a predicted result output by the battery-life prediction model and an actual result, thereby improving RUL prediction accuracy.

In a possible implementation, the multiple sets of first fitting data include multiple first fitting-capacity-values and multiple first fitting-cycle-numbers corresponding to the multiple first fitting-capacity-values, and the multiple sets of second fitting data include multiple second fitting-capacity-values, where according to the first capacity error, the second capacity error, the multiple sets of first fitting data, and the multiple sets of second fitting data, generate the battery-life prediction model as follows. When a ratio of the first capacity error to the second capacity error is less than a preset threshold, generate the battery-life prediction model according to the first capacity error, the second capacity error, the multiple first fitting-capacity-values, and the multiple second fitting-capacity-values. When the ratio of the first capacity error to the second capacity error is greater than or equal to the preset threshold, obtain a fitting-failure-cycle-number in the multiple first fitting-cycle-numbers, and generate the battery-life prediction model according to the fitting-failure-cycle-number and a cubic polynomial algorithm.

It can be seen that, different battery-life prediction models respectively for different conditions are generated through fitting by comprehensively considering whether the ratio of the first capacity error to the second capacity error is less than the preset threshold, and these battery-life prediction models respectively for different conditions are generated through fitting by coupling data obtained with different models or algorithms, so that the battery-life prediction models obtained can more accurately predict an RUL of a long-life battery in the case of predicting the RUL of the long-life battery.

In a possible implementation, when the ratio of the first capacity error to the second capacity error is less than the preset threshold, generate the battery-life prediction model according to the first capacity error, the second capacity error, the multiple first fitting-capacity-values, and the multiple second fitting-capacity-values as follows. Determine a sum of the first capacity error and the second capacity error as a first numerical value. Obtain a ratio of the first capacity error to the first numerical value and determine the ratio of the first capacity error to the first numerical value as a first weight value. Obtain a ratio of the second capacity error to the first numerical value and determine the ratio of the second capacity error to the first numerical value as a second weight value. Generate the battery-life prediction model according to a sum of a product of each of the multiple first fitting-capacity-values and the first weight value and a product of each of the multiple second fitting-capacity-values and the second weight value.

It can be seen that, when the ratio of the first capacity error to the second capacity error is less than the preset threshold, the battery-life prediction model directly outputs predicted capacity data corresponding to a predicted failure-cycle-number, which reduces calculation and improves prediction efficiency. Then determine current capacity data of the battery according to a current cycle number of the battery, and determine the RUL of the battery according to a difference value between the predicted capacity data and the current capacity data.

In a possible implementation, when the ratio of the first capacity error to the second capacity error is greater than or equal to the preset threshold, obtain the fitting-failure-cycle-number in the multiple sets of first fitting-cycle-numbers and generate the battery-life prediction model according to the fitting-failure-cycle-number and the cubic polynomial algorithm as follows. Determine multiple first fitting-capacity-values corresponding to first fitting-cycle-numbers arranged before the fitting-failure-cycle-number of the battery in the multiple first fitting-cycle-numbers as multiple valid capacity values. Generate the battery-life prediction model according to the multiple valid capacity values and the cubic polynomial algorithm.

It can be seen that, the multiple first fitting-capacity-values corresponding to first fitting-cycle-numbers before the fitting-failure-cycle-number are to fit the cubic polynomial algorithm, to ensure that data for fitting the cubic polynomial algorithm is proximate to an actual capacity value of the battery, thereby improving prediction accuracy of the battery-life prediction model. Meanwhile, compared with fitting the cubic polynomial algorithm with the obtained multiple capacity data, for the case where the cubic polynomial algorithm is fitted with the multiple valid capacity values that are obtained with the bi-exponential empirical model, the valid capacity values include first fitting-capacity-values corresponding to cycle numbers between the cycle number obtained and the fitting-failure-cycle-number, so that there may be abundant data for fitting the cubic polynomial algorithm, thereby improving prediction accuracy of the battery-life prediction model.

In a possible implementation, according to the predetermined battery-capacity-value and the battery-life prediction model, determine the RUL of the battery as follows. Determine, with the battery-life prediction model, a predicted failure-cycle-number corresponding to a case where a capacity value of the battery reaches the predetermined battery-capacity-value. Determine the current cycle number of the battery. Calculate a cycle-number difference value between the predicted failure-cycle-number and the current cycle number. Determine the RUL of the battery according to the cycle-number difference value.

It can be seen that, different battery-life predication models are determined according to the first capacity error and the second capacity error, and battery-life predication models respectively for different conditions are obtained by coupling data obtained with different models, thereby effectively avoiding a too large prediction error, and thus accurately predicting the RUL of the long-life battery.

In a second aspect, a battery management system is provided in the disclosure. The battery management system includes a first obtaining module, a first fitting module, a second fitting module, a second obtaining module, a third obtaining module, a first determining module, and a second determining module. The first obtaining module is configured to obtain multiple cycle numbers of a battery and multiple capacity data corresponding to the multiple cycle numbers of the battery, where the multiple cycle numbers are multiple cycle numbers of the battery at multiple time nodes in a previous time period. The first fitting module is configured to obtain multiple sets of first fitting data by fitting the multiple cycle numbers and the multiple capacity data with a bi-exponential empirical model. The second fitting module is configured to obtain multiple sets of second fitting data by fitting the multiple cycle numbers and the multiple capacity data with a box-cox transformation method. The second obtaining module is configured to determine a first capacity error corresponding to the multiple cycle numbers according to the multiple sets of first fitting data and the multiple capacity data. The third obtaining module is configured to determine a second capacity error corresponding to the multiple cycle numbers according to the multiple sets of second fitting data and the multiple capacity data. The first determining module is configured to generate a battery-life prediction model according to the first capacity error, the second capacity error, the multiple sets of first fitting data, and the multiple sets of second fitting data. The second determining module is configured to determine an RUL of the battery according to a predetermined battery-capacity-value and the battery-life prediction model.

In a third aspect, an electricity-consumption device is provided in the disclosure. The electricity-consumption device includes a processor and a memory, where the processor is connected with the memory, and the memory is configured to store computer programs which include program instructions, where the processor is configured to invoke the program instructions to implement the method for predicting a life in the first aspect.

In a fourth aspect, a computer-readable storage medium is provided in the disclosure. The computer-readable storage medium is configured to store computer programs, where the computer programs include program instructions which are executed by a processor to implement the method for predicting a life in the first aspect.

In the method for predicting a life of a battery, the battery management system, the electricity-consumption device, and the computer-readable storage medium of the present disclosure, the multiple cycle numbers of the battery and the capacity data that is in one-to-one correspondence with the cycle numbers are fitted with the bi-exponential empirical model, to obtain the multiple sets of first fitting data, where the multiple cycle numbers are multiple cycle numbers of the battery at the multiple time nodes in the previous time period, and the previous time period refers to a whole time period from a time point at which the battery underwent the first time of charging and discharging to a time point at which the battery has undergone multiple times of charging and discharging. The multiple cycle numbers of the battery and the capacity data that is in one-to-one correspondence with the cycle numbers are fitted with the box-cox transformation method, to obtain the multiple sets of second fitting data. The first capacity error between the multiple sets of first fitting data and the multiple capacity data is calculated, and the second capacity error between the multiple sets of second fitting data and the multiple capacity data is calculated. The battery-life predication model is generated according to the first capacity error, the second capacity error, the multiple sets of first fitting data, and the multiple sets of second fitting data. The RUL of the battery is obtained according to the predetermined battery-capacity-value and the battery-life predication model. In the disclosure, the bi-exponential empirical model is coupled with the box-cox transformation method, to avoid a too large prediction error caused by separately using the bi-exponential empirical model or the box-cox transformation method, thereby accurately predicting the RUL of the long-life battery (e.g., an energy-storage battery).

BRIEF DESCRIPTION OF THE DRAWINGS

In order to describe technical solutions in implementations of the disclosure more clearly, the following will give a brief introduction to accompanying drawings required for describing implementations.

Figure 1:
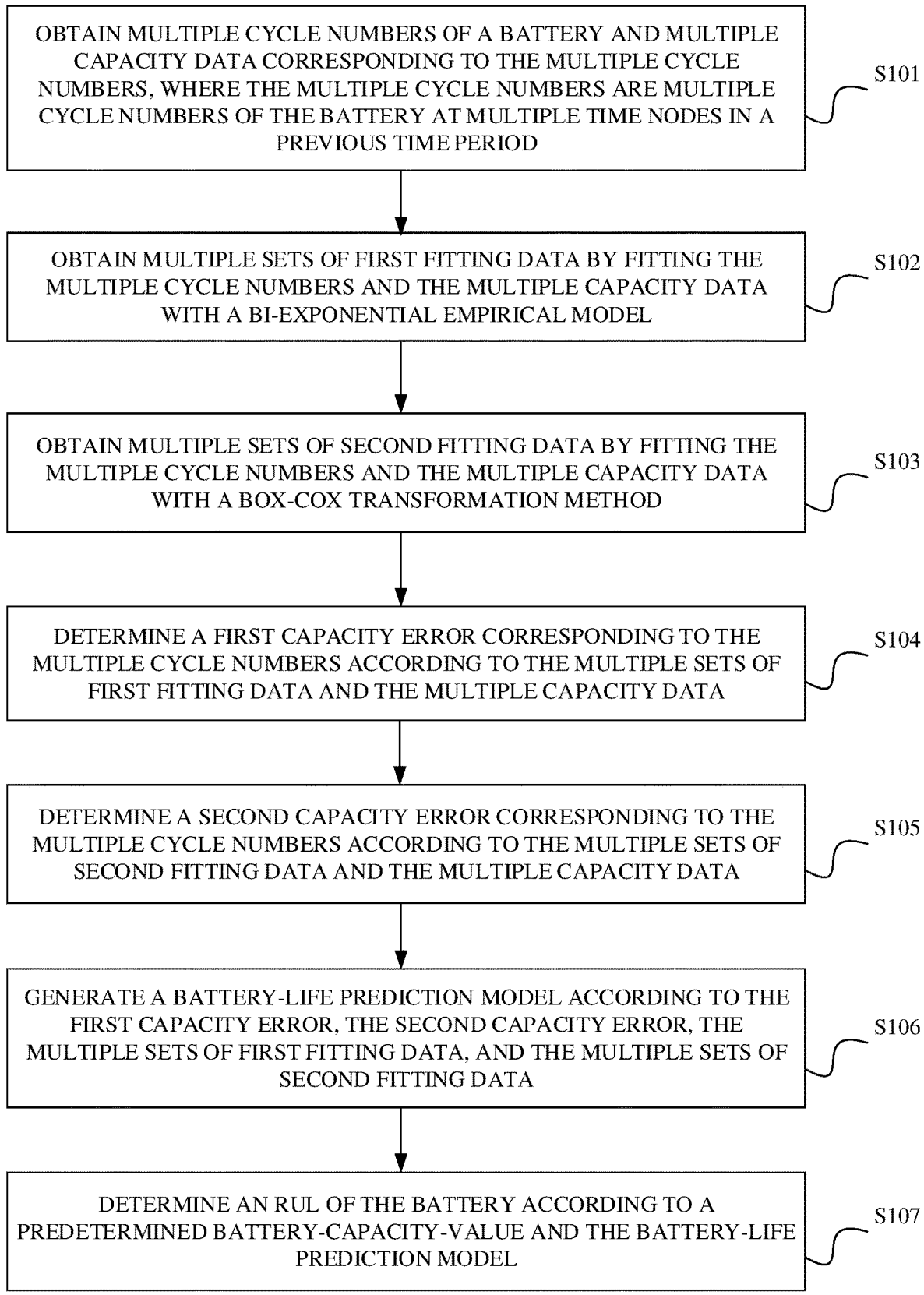
FIG. 1 is a schematic flow chart illustrating a method for predicting a life of a battery provided in implementations of the disclosure.

Reference signs in the accompanying drawings: battery management system 700, first obtaining module 701, first fitting module 702, second fitting module 703, second obtaining module 704, third obtaining module 705, first determining module 706, second determining module 707, electricity-consumption device 800, bus 20, processor 30, memory 50, communication interface 70.

DETAILED DESCRIPTION

The following will illustrate clearly and completely technical solutions of implementations of the disclosure with reference to accompanying drawings of implementations of the disclosure. Apparently, implementations illustrated herein are merely some, rather than all implementations, of the disclosure. Based on the implementations of the disclosure, all other implementations obtained by those of ordinary skill in the art without creative effort shall fall within the protection scope of the disclosure.

Illustration of the following implementations is provided with reference to the accompanying drawings to exemplarily illustrate specific implementations that can be implemented in the disclosure. In the disclosure, directional terms mentioned herein, such as "on", "under", "front", "back", "left", "right", "in", "out", "side", etc., indicate only directions with reference to the accompanying drawings, and the directional terms used are for better and clearer illustration and understanding of the disclosure, rather than explicitly or implicitly indicate that apparatuses or elements referred to herein must have a certain orientation or be configured and operated in a specific orientation and therefore cannot be understood as limitations to the disclosure.

In addition, sequence numbers for components recited herein, such as "first", "second", etc., are used merely to distinguish described objects and do not have any sequence or technical meaning. The terms "connecting" and "coupling" in the disclosure, unless specified otherwise, both include direct connection and indirect connection (coupling).

In actual application of energy-storage batteries, the capacity of the energy-storage battery may decrease with the increase of the number of charge and discharge cycles, and thus the performance of the energy-storage battery gradually deteriorates, and the energy-storage battery may have a battery-life failure problem, which may cause safety accidents. Therefore, prediction of a remaining useful life (RUL) of the energy-storage battery is particularly important. The RUL of the energy-storage battery refers to the number of charge and discharge cycles of the energy-storage battery in a time period from the current time to a time point at which the output power of the energy-storage battery cannot satisfy normal operation of a machine or a device, i.e., from the current time to a time point at which the energy-storage battery reaches a failure threshold. However, since the energy-storage battery has a relatively long useful life, capacity values and cycle numbers no longer approach a linear relationship in a case where cycle numbers are relatively large, as a result, it cannot be ensured that the RUL of the energy-storage battery with a long life can be predicated accurately.

For solving the above problem, a method for predicting a life of a battery is provided in the disclosure. In the method for predicting a life of a battery in the disclosure, multiple cycle numbers of the battery and capacity data that is in one-to-one correspondence with the cycle numbers are fitted with a bi-exponential empirical model, to obtain multiple sets of first fitting data, where the multiple cycle numbers are multiple cycle numbers of the battery at multiple time nodes in a previous time period, and the previous time period refers to a whole time period from a time point at which the battery underwent the first time of charging and discharging to a time point at which the battery has undergone multiple times of charging and discharging. The multiple cycle numbers of the battery and the capacity data that is in one-to-one correspondence with the cycle numbers are fitted with a box-cox transformation method, to obtain multiple sets of second fitting data. A first capacity error between the multiple sets of first fitting data and the multiple capacity data is calculated, and a second capacity error between the multiple sets of second fitting data and the multiple capacity data is calculated. A battery-life predication model is generated according to the first capacity error, the second capacity error, the multiple sets of first fitting data, and the multiple sets of second fitting data. An RUL of the battery is obtained according to a predetermined battery-capacity-value and the battery-life predication model. In the disclosure, the bi-exponential empirical model is coupled with the box-cox transformation method, to avoid a too large prediction error caused by separately using the bi-exponential empirical model or the box-cox transformation method, thereby accurately predicting an RUL of a long-life battery (e.g., an energy-storage battery).

It needs to be noted that, the battery in the disclosure may include an energy-storage battery and a power battery. For the power battery, a cycle life is relatively short, and capacity data and cycle numbers are in a simple linear relationship. When the battery-life prediction model in the method for predicting a life provided in the disclosure is used to predict an RUL of the power battery, an error between a predicted result and an actual result can be relatively small, thereby improving prediction accuracy. For the energy-storage battery with a relatively long life, capacity data and cycle numbers are in a linear relationship at an earlier stage, but at a later stage, capacity data decreases exponentially with increase of cycle numbers due to problems of the energy-storage battery such as lithium precipitation, reduction in porosity, etc. With the battery-life prediction model in the method for predicting a life provided in the disclosure, the bi-exponential empirical model is coupled with the box-cox transformation method, to reduce the error between the predicted result and the actual result, thereby improving life prediction accuracy.

Referring to FIG. 1, FIG. 1 is a schematic flow chart illustrating a method for predicting a life of a battery provided in implementations of the disclosure. The method for predicting a life includes operations at S101-S107.

At S101, obtain multiple cycle numbers of the battery and multiple capacity data corresponding to the multiple cycle numbers, where the multiple cycle numbers are multiple cycle numbers of the battery at multiple time nodes in a previous time period.

It can be understood that, the multiple cycle numbers are multiple cycle numbers of the battery at the multiple time nodes in the previous time period, and the previous time period refers to a whole time period from a time point at which the battery underwent the first time of charging and discharging to a time point at which the battery has undergone multiple times of charging and discharging, where each time node in the previous time period corresponds to one cycle number and one capacity data. The cycle numbers of the battery are in one-to-one correspondence with the capacity data, the multiple cycle numbers are historical cycle numbers of the battery, and each capacity data is historical capacity data of the battery. For example, if a current cycle number of the battery is 3000, and capacity data corresponding to the current cycle number is Q1, there are 3000 cycle numbers and 3000 capacity data, and thus cycle number 1 to cycle number 3000 and capacity data corresponding to cycle number 1 to cycle number 3000 are input to a bi-exponential empirical model and a box-cox transformation method.

At S102, obtain multiple sets of first fitting data by fitting the multiple cycle numbers and the multiple capacity data with the bi-exponential empirical model.

The multiple sets of first fitting data are obtained by fitting the multiple cycle numbers and the multiple capacity data with the bi-exponential empirical model. Each of the multiple sets of first fitting data includes a first fitting-cycle-number and a first fitting-capacity-value, where each first fitting-capacity-value is fitting data obtained by fitting corresponding capacity data with the bi-exponential empirical model. If the number of cycle numbers obtained is less than a failure cycle number, the number of the first fitting-capacity-values is greater than the number of capacity data. For example, if the failure cycle number is 4000 and the number of cycle numbers obtained is 3000, there may be 4000 first fitting-capacity-values and 3000 capacity data.

At S103, obtain multiple sets of second fitting data by fitting the multiple cycle numbers and the multiple capacity data with the box-cox transformation method.

Similarly, the multiple sets of second fitting data are obtained by fitting the multiple cycle numbers and the multiple capacity data with the box-cox transformation method. Each of the multiple sets of second fitting data includes a second fitting-cycle-number and a second fitting-capacity-value. If the number of cycle numbers obtained is less than the failure cycle number, the number of the second fitting-capacity-values is greater than the number of capacity data. For example, if the failure cycle number is 4000 and the number of cycle numbers obtained is 3000, there may be 4000 second fitting-capacity-value and 3000 capacity data.

At S104, determine a first capacity error corresponding to the multiple cycle numbers according to the multiple sets of first fitting data and the multiple capacity data.

In a possible implementation, according to the multiple sets of first fitting data and the multiple capacity data, determine the first capacity error corresponding to the multiple cycle numbers as follows. Calculate a first difference value between each first fitting-capacity-value and each capacity data that correspond to each of the multiple cycle numbers to obtain multiple first difference values. Obtain a sum of squares of the first difference values corresponding to the multiple cycle numbers by summing the squares of the first difference values. Obtain the first capacity error by extracting a square root of the sum of the squares of the first difference values.

After obtaining the multiple cycle numbers, calculate the first difference value between each first fitting-capacity-value and each capacity data that correspond to each cycle number, where the number of first fitting-capacity-values, the number of capacity data, and the number of cycle numbers are the same. The first difference value between each first fitting-capacity-value and each capacity data that correspond to each cycle number is calculated to obtain multiple first difference values, where the number of the first difference values is equal to the number of cycle numbers. The first difference values corresponding to the multiple cycle numbers are squared to obtain the squares of the first difference values, and the squares of the first difference values are summed to obtain the sum of the squares of the first difference values. The first capacity error is obtained by extracting the square root of the sum of the squares of the first difference values. The first capacity error is calculated with the following expression 1.

$$RSE_{bi-exp} = \sqrt{\sum_{i=1}^{N}(bipred_i - \exp_i)^2} \quad \text{Expression 1}$$

where $RSE_{bi-exp}$ represents a first capacity error, $bipred_i$ represents a first fitting-capacity-value corresponding to an i-th cycle number (i.e., an i-th cycle), $\exp_i$ represents capacity data corresponding to the i-th cycle number, N represents the number of cycle numbers, and i is a positive integer.

According to expression 1, it can be understood that, for the first fitting data obtained through fitting with the bi-exponential empirical model, a root square error (RSE) ($RSE_{bi-exp}$ herein) represents an RSE calculated with the first fitting-capacity-values and the capacity data. That is, in the disclosure, the RSE is used to represent the first capacity error, and effect of the first capacity error on battery life prediction is analyzed, to avoid a too large error between a predicted result output by the battery-life prediction model and an actual result, thereby improving RUL prediction accuracy.

At S105, determine a second capacity error corresponding to the multiple cycle numbers according to the multiple sets of second fitting data and the multiple capacity data.

In a possible implementation, according to the multiple sets of second fitting data and the multiple capacity data, determine the second capacity error corresponding to the multiple cycle numbers as follows. Calculate a second difference value between each second fitting-capacity-value and each capacity data that correspond to each of the multiple cycle numbers to obtain multiple second difference values. Obtain a sum of squares of the second difference values corresponding to the multiple cycle numbers by summing the squares of the second difference values. Obtain the second capacity error by extracting a square root of the sum of the squares of the second difference values.

Similarly, after obtaining the multiple cycle numbers, calculate the second difference value between each second fitting-capacity-value and each capacity data that correspond to each cycle number, where the number of second fitting-capacity-values, the number of capacity data, and the number of cycle numbers are the same. The second difference value between each second fitting-capacity-value and each capacity data that correspond to each cycle number is calculated to obtain multiple second difference values, where the number of second difference values is equal to the number of cycle numbers. The second difference values corresponding to the multiple cycle numbers are squared to obtain the squares of the second difference values, and the squares of the second difference values are summed to obtain the sum of the squares of the second difference values. The second capacity error is obtained by extracting the square root of the sum of the squares of the second difference values. The second capacity error is calculated with the following expression 2.

$$RSE_{box-cox} = \sqrt{\sum_{i=1}^{N}(boxpred_i - \exp_i)^2}$$ Expression 2 where $RSE_{box-cox}$ represents a second capacity error, $boxpred_i$ represents a second fitting-capacity-value corresponding to an i-th cycle number (i.e., an i-th cycle), $\exp_i$ represents capacity data corresponding to the i-th cycle number, N represents the number of cycle numbers, and i is a positive integer.

According to expression 2, it can be understood that, for the second fitting data obtained through fitting with the box-cox transformation method, $RSE_{box-cox}$ represents an RSE calculated with the second fitting-capacity-values and the capacity data. That is, in the disclosure, the RSE is used to represent the second capacity error, and effect of the first capacity error and the second capacity error on battery life prediction is comprehensively analyzed, to avoid a too large error between a predicted result output by the battery-life prediction model and an actual result, thereby improving RUL prediction accuracy.

At S106, generate a battery-life prediction model according to the first capacity error, the second capacity error, the multiple sets of first fitting data, and the multiple sets of second fitting data.

In a possible implementation, according to the first capacity error, the second capacity error, the multiple sets of first fitting data, and the multiple sets of second fitting data, generate the battery-life prediction model as follows. When a ratio of the first capacity error to the second capacity error is less than a preset threshold, generate the battery-life prediction model according to the first capacity error, the second capacity error, the multiple first fitting-capacity-values, and the multiple second fitting-capacity-values. When the ratio of the first capacity error to the second capacity error is greater than or equal to the preset threshold, obtain a fitting-failure-cycle-number in the multiple first fitting-cycle-numbers, and generate the battery-life prediction model according to the fitting-failure-cycle-number and a cubic polynomial algorithm. It is to be noted that the fitting-failure-cycle-number may refer to that when the current cycle number of the battery equals the fitting-failure-cycle number, failure of the battery may occur.

It needs to be noted that, a same preset threshold is set for batteries of the same type, where the preset threshold can be determined according to multiple curves obtained by training the battery-life predication model for the batteries of the same type. Preferably, a slope at a linearly decreasing stage of a curve with a minimum error is selected as the preset threshold. The number of the multiple sets of first fitting data is the number of the first fitting-cycle-numbers obtained through fitting with the bi-exponential empirical model. The number of the multiple sets of second fitting data is the number of the second fitting-cycle-numbers obtained through fitting with the box-cox transformation method.

When the ratio of the first capacity error to the second capacity error is less than the preset threshold, according to the first capacity error and the second capacity error, perform weighted averaging on the multiple sets of first fitting data obtained with the bi-exponential empirical model and the multiple sets of second fitting data obtained with the box-cox transformation method, and predict, with weighted averaging, a cycle number (i.e., a predicted failure-cycle-number) corresponding to a case where the capacity value of the battery reaches a predetermined battery-capacity-value, and thus obtain an RUL of the battery according to the predicted failure-cycle-number and a cycle number obtained (i.e., the current cycle number of the battery). As such, it is possible to avoid a too large error between a predicted result and an actual result generated by separately using the bi-exponential empirical model or the box-cox transformation method to predict the RUL of the battery, and thus the battery can be safely used.

When the ratio of the first capacity error to the second capacity error is greater than or equal to the preset threshold, fit a cubic polynomial algorithm with multiple first fitting-capacity-values corresponding to first fitting-cycle-numbers before the fitting-failure-cycle-number of the battery in the multiple sets of first fitting data that are obtained with the bi-exponential empirical model, to determine multiple parameters for the cubic polynomial algorithm, and thus a fitted cubic polynomial algorithm is obtained to predict the predicted failure-cycle-number corresponding to a case where the capacity value of the battery reaches the predetermined battery-capacity-value, and thus the RUL of the battery is determined according to the predicted failure-cycle-number and the current cycle number of the battery.

In the disclosure, different battery-life prediction models respectively for different conditions are generated through fitting by comprehensively considering whether the ratio of the first capacity error to the second capacity error is less than the preset threshold, and these battery-life prediction models respectively for different conditions are generated through fitting by coupling data obtained with different models or algorithms, so that the battery-life prediction models obtained can more accurately predict an RUL of a long-life battery in the case of predicting the RUL of the long-life battery.

When the ratio of the first capacity error to the second capacity error is less than the preset threshold, generate the battery-life prediction model according to the first capacity error, the second capacity error, the multiple first fitting-capacity-values, and the multiple second fitting-capacity-values as follows. Determine a sum of the first capacity error and the second capacity error as a first numerical value. Obtain a ratio of the first capacity error to the first numerical value and determine the ratio of the first capacity error to the first numerical value as a first weight value. Obtain a ratio of the second capacity error to the first numerical value and determine the ratio of the second capacity error to the first numerical value as a second weight value. Generate the battery-life prediction model according to a sum of a product of each of the multiple first fitting-capacity-values and the first weight value and a product of each of the multiple second fitting-capacity-values and the second weight value.

Specifically, when the ratio of the first capacity error to the second capacity error is less than the preset threshold, obtain the first numerical value by summing the first capacity error and the second capacity error, determine the ratio of the first capacity error to the first numerical value as the first weight value, and determine the ratio of the second capacity error to the first numerical value as the second weight value. Obtain a first-fitting-capacity-value product by multiplying each first fitting-capacity-value by the first weight value, obtain a second-fitting-capacity-value product by multiplying each second fitting-capacity-value by the second weight value, and obtain predicted capacity data corresponding to the predicted failure-cycle-number by summing the first-fitting-capacity-value product and the second-fitting-capacity-value product. That is, when the ratio of the first capacity error to the second capacity error is less than the preset threshold, the battery-life predication model directly outputs the predicted capacity data corresponding to the predicted failure-cycle-number of the battery, where the battery-life predication model is the following expression 3.

Expression 3: $\text{pred}=\text{pred}_{bi\text{-}exp}*[\text{error}_{box\text{-}cox}/(\text{error}_{bi\text{-}exp}+\text{error}_{box\text{-}cox})]+\text{pred}_{box\text{-}cox}*[\text{error}_{bi\text{-}exp}/(\text{error}_{bi\text{-}exp}+\text{error}_{box\text{-}cox})]$, where pred represents predicted capacity data corresponding to a predicted failure-cycle-number, $\text{pred}_{bi\text{-}exp}$ represents multiple first fitting-capacity-values predicted with the bi-exponential empirical model, $\text{pred}_{box\text{-}cox}$ represents multiple second fitting-capacity-values predicted with the box-cox transformation method, $\text{error}_{bi\text{-}exp}$ represents a first capacity error (i.e., $\text{RSE}_{bi\text{-}exp}$ calculated with expression 1), and $\text{error}_{box\text{-}cox}$ represents a second capacity error (i.e., $\text{RSE}_{box\text{-}cox}$ calculated with expression 2). The first capacity error and the second capacity error each are a determined numerical value, and the first weight value calculated and the second weight value calculated each are a determined numerical value.

When the ratio of the first capacity error to the second capacity error is less than the preset threshold, the battery-life prediction model directly outputs predicted capacity data corresponding to the predicted failure-cycle-number, which reduces calculation and improves prediction efficiency. Then determine current capacity data of the battery according to the current cycle number of the battery, and determine the RUL of the battery according to a difference value between the predicted capacity data and the current capacity data.

When the ratio of the first capacity error to the second capacity error is greater than or equal to the preset threshold, obtain the fitting-failure-cycle-number in the multiple sets of first fitting data and generate the battery-life prediction model according to the fitting-failure-cycle-number and the cubic polynomial algorithm as follows. Determine multiple first fitting-capacity-values corresponding to first fitting-cycle-numbers arranged before the fitting-failure-cycle-number of the battery in the multiple first fitting-cycle-numbers as multiple valid capacity values. Generate the battery-life prediction model according to the multiple valid capacity values and the cubic polynomial algorithm.

When the ratio of the first capacity error to the second capacity error is greater than or equal to the preset threshold, obtain the fitting-failure-cycle-number predicted with the bi-exponential empirical model, determine the multiple first fitting-capacity-values corresponding to the first fitting-cycle-numbers arranged before the fitting-failure-cycle-number of the battery in the multiple first fitting-cycle-numbers as the multiple valid capacity values. Input the multiple valid capacity values to a cubic polynomial algorithm without a determined parameter, to obtain multiple parameters for the cubic polynomial algorithm, so that a cubic polynomial for capacity data and cycle numbers, i.e., the battery-life predication model, is obtained. In the disclosure, the multiple first fitting-capacity-values corresponding to first fitting-cycle-numbers before the fitting-failure-cycle-number are to fit the cubic polynomial algorithm, to ensure that data for fitting the cubic polynomial algorithm is proximate to an actual capacity value of the battery, thereby improving prediction accuracy of the battery-life prediction model. Meanwhile, compared with fitting the cubic polynomial algorithm with the obtained multiple capacity data, for the case where the cubic polynomial algorithm is fitted with the multiple valid capacity values that are obtained with the bi-exponential empirical model, the valid capacity values include first fitting-capacity-values corresponding to cycle numbers between the cycle number obtained and the fitting-failure-cycle-number, so that there may be abundant data for fitting the cubic polynomial algorithm, thereby improving prediction accuracy of the battery-life prediction model.

When the ratio of the first capacity error to the second capacity error is greater than or equal to the preset threshold, the battery-life predication model is an expression for capacity data and cycle numbers, as illustrated in expression 4.

Expression 4: $y=ax^3+bx^2+cx+d$, where a, b, c, and d each are a parameter for a cubic polynomial (the battery-life predication model), x represents a cycle number, and y represents capacity data.

According to expression 4, capacity data corresponding to each cycle number can be calculated, and thus a relationship curve between capacity data and cycle numbers can be obtained. According to the relationship curve between capacity data and cycle numbers, the predicted failure-cycle-number corresponding to a case where the capacity value of the battery reaches the predetermined battery-capacity-value can be obtained. The cycle-number difference value is obtained by subtracting the predicted failure-cycle-number from the current cycle number of the battery, and the RUL of the battery is determined according to the cycle-number difference value.

At S107, determine the RUL of the battery according to the predetermined battery-capacity-value and the battery-life prediction model.

The predetermined battery-capacity-value may be a failure capacity value of the battery, for example, the predetermined battery-capacity-value is 70% of an initial capacity value of the battery. After determining the predetermined battery-capacity-value, obtain, with the battery-life predication model, the predicted failure-cycle-number corresponding to the predetermined battery-capacity-value, obtain the cycle-number difference value by subtracting the predicted failure-cycle-number from the current cycle number, and determine the RUL of the battery according to the cycle-number difference value.

In a possible implementation, according to the predetermined battery-capacity-value and the battery-life prediction model, determine the RUL of the battery as follows. Determine, with the battery-life prediction model, the predicted failure-cycle-number corresponding to the case where the capacity value of the battery reaches the predetermined battery-capacity-value. Determine the current cycle number of the battery. Calculate the cycle-number difference value between the predicted failure-cycle-number and the current cycle number. Determine the RUL of the battery according to the cycle-number difference value.

For example, when the ratio of the first capacity error to the second capacity error is less than the preset threshold, the battery-life prediction model directly outputs predicted capacity data corresponding to the predicted failure-cycle-number. Then obtain the predicted failure-cycle-number according to the predicted capacity data, obtain the cycle-number difference value by subtracting the predicted failure-cycle-number from the current cycle number, and determine the RUL of the battery according to the cycle-number difference value.

For example, when the ratio of the first capacity error to the second capacity error is greater than or equal to the preset threshold, the battery-life predication model is a cubic polynomial for cycle numbers and capacity data. Obtain the predicted capacity data with the battery-life predication model according to the predicted failure-cycle-number corresponding to a case where the capacity value of the battery reaches the predetermined battery-capacity-value, obtain the predicted failure-cycle-number corresponding to the predicted capacity data, obtain the cycle-number difference value by subtracting the predicted failure-cycle-number from the current cycle number, and determine the RUL of the battery according to the cycle-number difference value.

Figure 2:
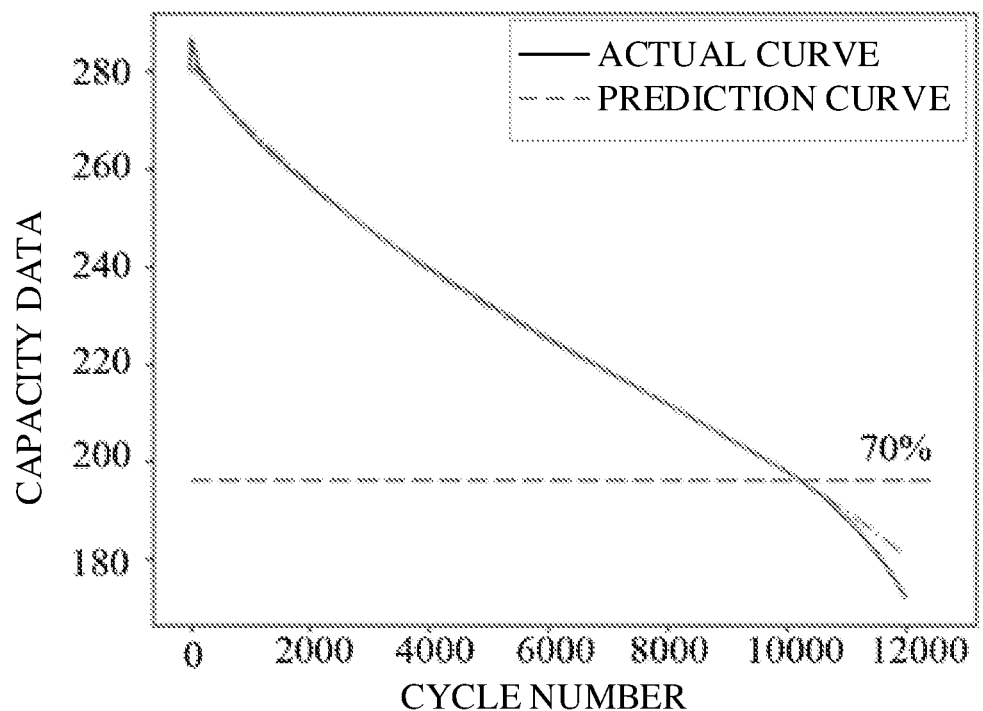
FIGS. 2-6 are diagrams each illustrating a relationship between a prediction curve obtained with a battery-life prediction model and an actual curve in actual use provided in implementations of the disclosure.
Figure 3:
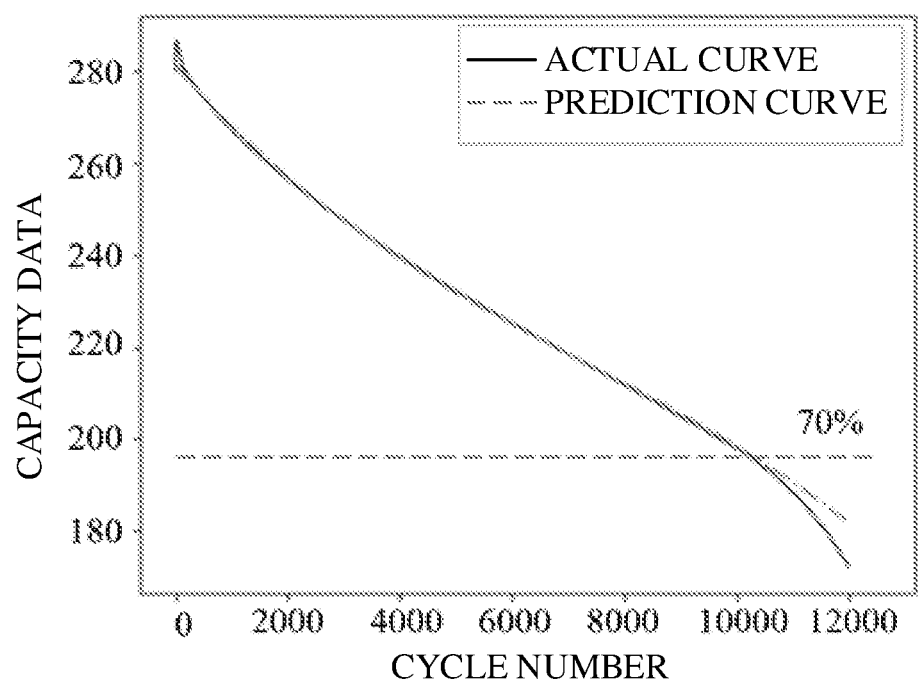
Figure 4:
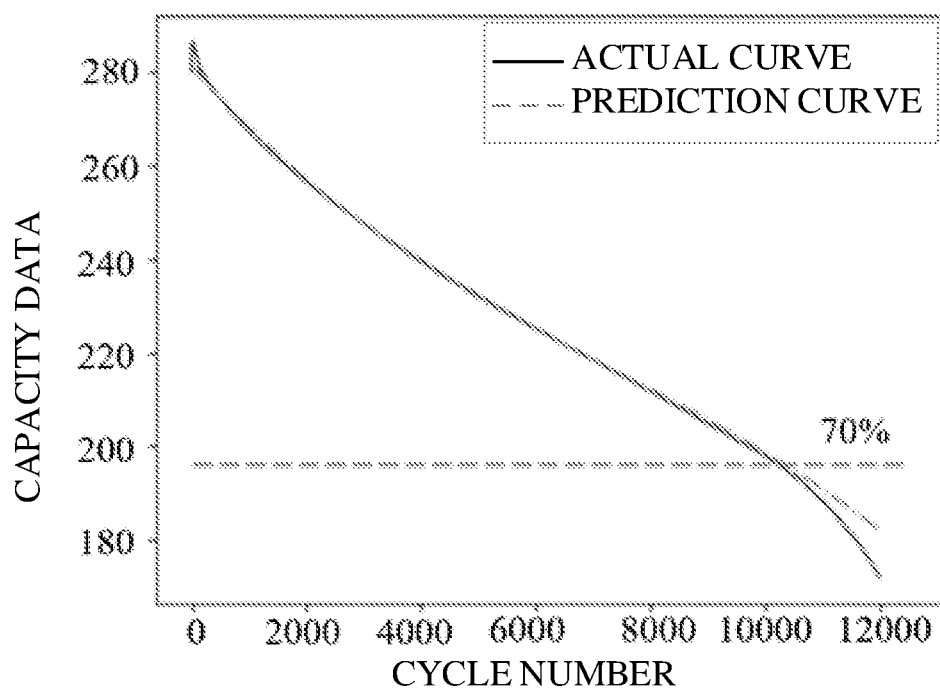
Figure 5:
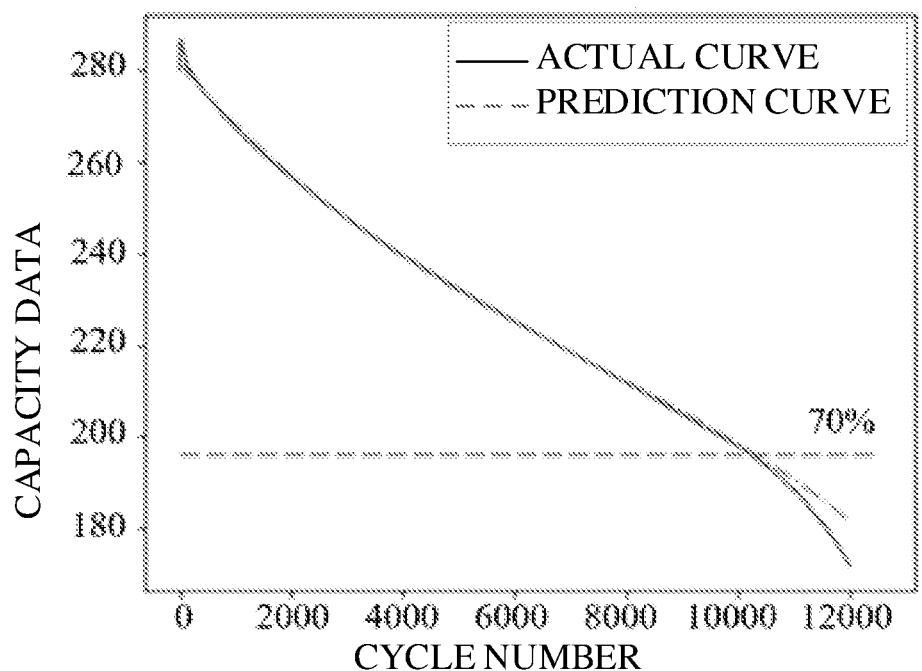
Figure 6:
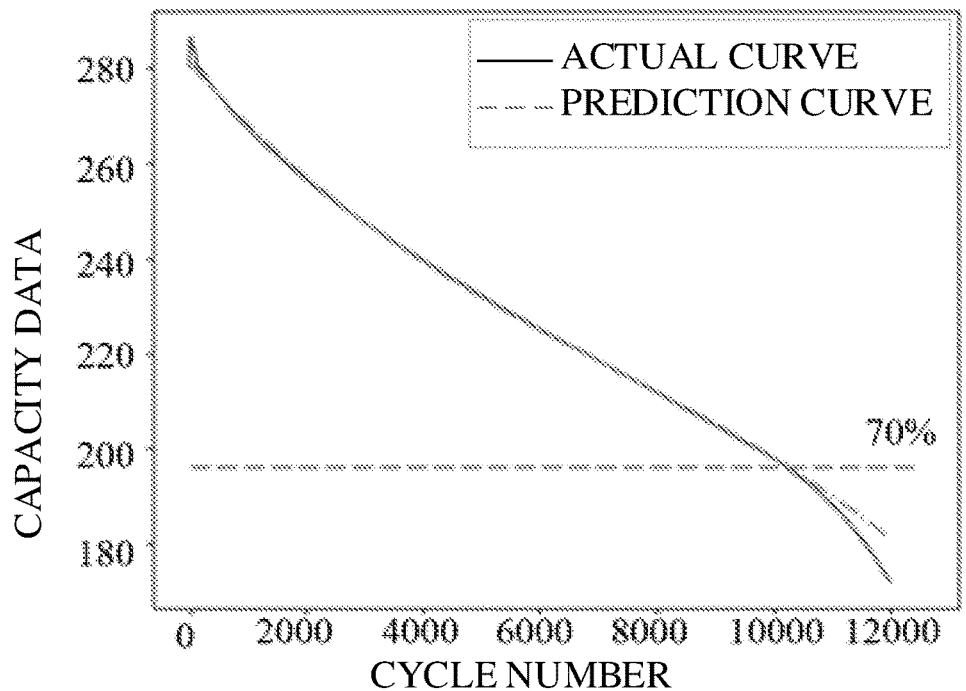

In conjunction with FIGS. 2-6, FIGS. 2-6 are diagrams each illustrating a relationship between a prediction curve obtained with the battery-life prediction model and an actual curve in actual use provided in implementations of the disclosure. In each figure, an abscissa represents a cycle number, an ordinate represents capacity data, data corresponding to an intersection of three lines in each figure is a predetermined capacity value, an actual curve indicates an actual relationship between capacity data and cycle numbers in an actual charging and discharging process of the battery, a prediction curve represents a predicted relationship curve obtained with the battery-life predication model, cycle numbers obtained are the multiple cycle numbers of the battery obtained in the operation at S101, and a cycle-number error represents an error between an actual failure-cycle-number and the predicted failure-cycle-number that corresponds to a case where the capacity value of the battery reaches the predetermined battery-capacity-value. FIG. 2 is a schematic diagram illustrating an actual curve of the battery in an actual charging and discharging process of the battery and a prediction curve that is obtained with the battery-life predication model when 6000 cycle numbers are obtained, where the cycle-number error is 9. FIG. 3 is a schematic diagram illustrating an actual curve of the battery in an actual charging and discharging process of the battery and a prediction curve that is obtained with the battery-life predication model when 7000 cycle numbers are obtained, where the cycle-number error is 84. FIG. 4 is a schematic diagram illustrating an actual curve of the battery in an actual charging and discharging process of the battery and a prediction curve that is obtained with the battery-life predication model when 8000 cycle numbers are obtained, where the cycle-number error is 115. FIG. 5 is a schematic diagram illustrating an actual curve of the battery in an actual charging and discharging process of the battery and a prediction curve that is obtained with the battery-life predication model when 9000 cycle numbers are obtained, where the cycle-number error is 91. FIG. 6 is a schematic diagram illustrating an actual curve of the battery in an actual charging and discharging process of the battery and a prediction curve that is obtained with the battery-life predication model when 10000 cycle numbers are obtained, where the cycle-number error is 36. Referring to FIGS. 2-6, the actual curve for cycle numbers and capacity data of the battery in the actual charging and discharging process of the battery and the prediction curve obtained with the battery-life predication model has a relatively small error, and thus RUL prediction accuracy is high.

The above describes in detail the method designed in implementations of the disclosure, and the following will provide a battery management system 700 designed in implementations of the disclosure.

Figure 7:
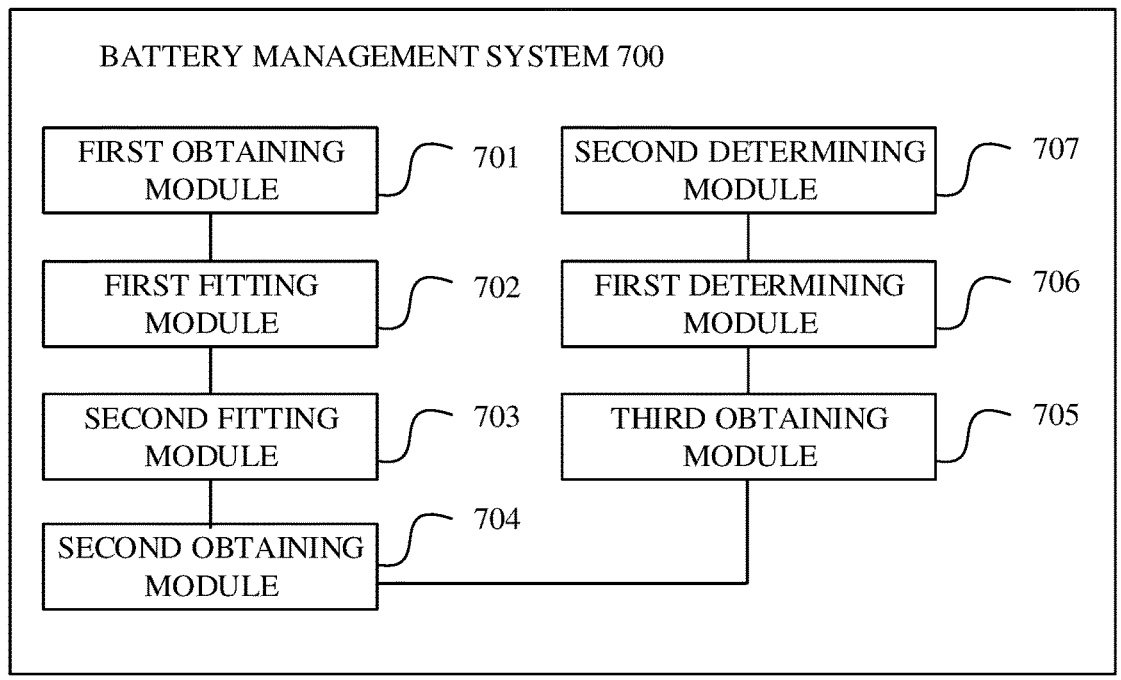
FIG. 7 is a schematic structural diagram illustrating a battery management system provided in implementations of the disclosure.

Referring to FIG. 7, FIG. 7 is a schematic structural diagram illustrating a battery management system 700 provided in implementations of the disclosure. The method for predicting a life of a battery provided in the disclosure is applied to the battery management system 700. The battery management system 700 includes a first obtaining module 701, a first fitting module 702, a second fitting module 703, a second obtaining module 704, a third obtaining module 705, a first determining module 706, and a second determining module 707. The first obtaining module 701 is configured to obtain multiple cycle numbers of a battery and multiple capacity data corresponding to the multiple cycle numbers of the battery, where the multiple cycle numbers are multiple cycle numbers of the battery at multiple time nodes in a previous time period. The first fitting module 702 is configured to obtain multiple sets of first fitting data by fitting the multiple cycle numbers and the multiple capacity data with a bi-exponential empirical model. The second fitting module 703 is configured to obtain multiple sets of second fitting data by fitting the multiple cycle numbers and the multiple capacity data with a box-cox transformation method. The second obtaining module 704 is configured to determine a first capacity error corresponding to the multiple cycle numbers according to the multiple sets of first fitting data and the multiple capacity data. The third obtaining module 705 is configured to determine a second capacity error corresponding to the multiple cycle numbers according to the multiple sets of second fitting data and the multiple capacity data. The first determining module 706 is configured to generate a battery-life prediction model according to the first capacity error, the second capacity error, the multiple sets of first fitting data, and the multiple sets of second fitting data. The second determining module 707 is configured to determine an RUL of the battery according to a predetermined battery-capacity-value and the battery-life prediction model.

It needs to be noted that, the battery management system 700 can record in time cycle numbers and capacity data that correspond to each battery, and the battery-life predication model for predicting the RUL of each battery has small calculation. Moreover, the RUL of each battery can be output in real time, and thus there is no need to transmit data remotely and wait for data transmission, thereby improving prediction efficiency.

In a possible implementation, each of the multiple sets of first fitting data includes a first fitting-capacity-value. The second obtaining module 704 is further configured to: calculate a first difference value between each first fitting-capacity-value and each capacity data that correspond to each of the multiple cycle numbers to obtain multiple first difference values, obtain a sum of squares of the first difference values corresponding to the multiple cycle numbers by summing the squares of the first difference values, and obtain the first capacity error by extracting a square root of the sum of the squares of the first difference values.

In a possible implementation, each of the multiple sets of second fitting data includes a second fitting-capacity-value. The third obtaining module 705 is further configured to: calculate a second difference value between each second fitting-capacity-value and each capacity data that correspond to each of the multiple cycle numbers to obtain multiple second difference values, obtain a sum of squares of the second difference values corresponding to the multiple cycle numbers by summing the squares of the second difference values, and obtain the second capacity error by extracting a square root of the sum of the squares of the second difference values.

In a possible implementation, the multiple sets of first fitting data include multiple first fitting-capacity-values and multiple first fitting-cycle-numbers corresponding to the multiple first fitting-capacity-values, and the multiple sets of second fitting data include multiple second fitting-capacity-values. The first determining module 706 is further configured to generate the battery-life prediction model according to the first capacity error, the second capacity error, the multiple first fitting-capacity-values, and the multiple second fitting-capacity-values, when a ratio of the first capacity error to the second capacity error is less than a preset threshold. Alternatively, the first determining module 706 is further configured to: obtain a fitting-failure-cycle-number in the multiple first fitting-cycle-numbers, and generate the battery-life prediction model according to the fitting-failure-cycle-number and a cubic polynomial algorithm, when the ratio of the first capacity error to the second capacity error is greater than or equal to the preset threshold.

In a possible implementation, the first determining module 706 is further configured to: determine a sum of the first capacity error and the second capacity error as a first numerical value, obtain a ratio of the first capacity error to the first numerical value and determine the ratio of the first capacity error to the first numerical value as a first weight value, obtain a ratio of the second capacity error to the first numerical value and determine the ratio of the second capacity error to the first numerical value as a second weight value, and generate the battery-life prediction model according to a sum of a product of each of the multiple first fitting-capacity-values and the first weight value and a product of each of the multiple second fitting-capacity- values and the second weight value, when the ratio of the first capacity error to the second capacity error is less than the preset threshold.

In a possible implementation, the first determining module 706 is further configured to: determine multiple first fitting-capacity-values corresponding to first fitting-cycle-numbers arranged before the fitting-failure-cycle-number of the battery in the multiple first fitting-cycle-numbers as multiple valid capacity values, and generate the battery-life prediction model according to the multiple valid capacity values and the cubic polynomial algorithm, when the ratio of the first capacity error to the second capacity error is greater than or equal to the preset threshold.

In a possible implementation, the second determining module 707 is further configured to: determine a predicted failure-cycle-number corresponding to a case where a capacity value of the battery reaches the predetermined battery-capacity-value according to the battery-life prediction model, determine a current cycle number of the battery, calculate a cycle-number difference value between the predicted failure-cycle-number and the current cycle number, and determine the RUL of the battery according to the cycle-number difference value.

Implementation of each module of the battery management system 700 can correspond to the illustration of any one of implementations of the method for predicting a life in the disclosure.

Figure 8:
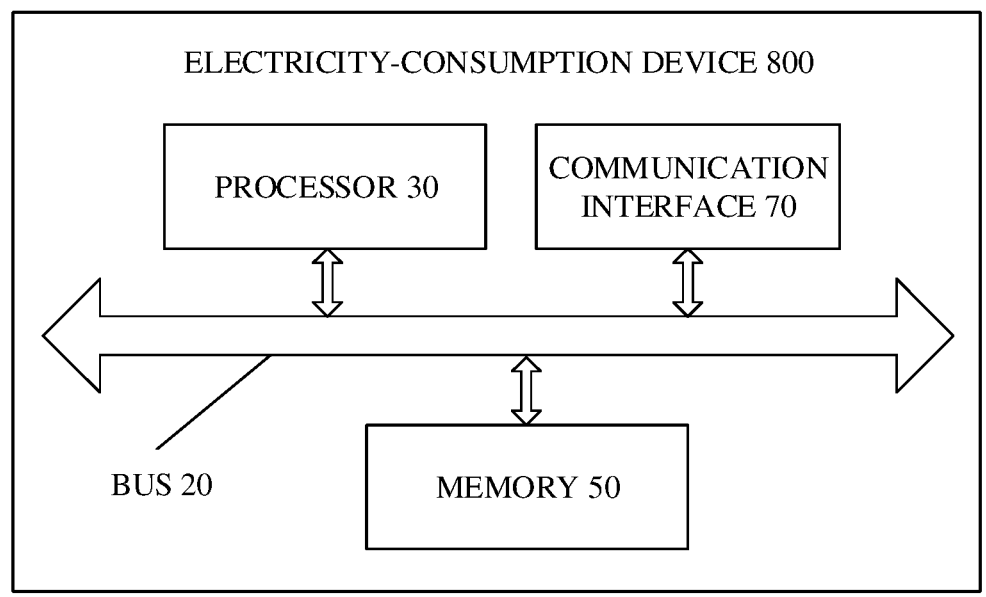
FIG. 8 is a schematic structural diagram illustrating an electricity-consumption device provided in implementations of the disclosure.

Referring to FIG. 8, FIG. 8 is a schematic structural diagram illustrating an electricity-consumption device 800 provided in implementations of the disclosure. The electricity-consumption device 800 may include a processor, a memory, and a communication interface, where the processor, the memory, and the communication interface are connected via a bus. The memory is configured to store computer programs which include program instructions, where the processor is configured to execute the program instructions to implement the method for predicting a life in any one of implementations in the disclosure.

The technical solutions of implementations in the disclosure are all applicable to various electricity-consumption devices 800 using an electricity-storage battery or a power battery, for example, a battery car, an electric toy, an electric tool, an electric vehicle, a ship, a spacecraft, a mobile phone, a portable device, a palmtop computer, a notebook computer, and the like.

In an implementation manner, functions of the communication interface 70 may be implemented by a transceiver circuit or a dedicated chip for transmitting and receiving. The processor 30 may be implemented by a dedicated processing chip, a processing circuit, a processor, or a universal chip.

For concepts, explanations, detailed illustration, and other operations related to the technical solutions provided in implementations in the disclosure that are involved in the electricity-consumption device 800, reference can be made to the foregoing method or the illustration of the operations of the method executed by the apparatus in other implementations, which are not repeated herein.

In another implementation manner of the implementation, a computer-readable storage medium is provided. The computer-readable storage medium is configured to store instructions which are executed to implement the method of any one of implementations in the disclosure.

In another implementation manner of the implementation, a computer program product is provided. The computer program product includes instructions which are executed to implement the method of any one of implementations in the disclosure.

It can be understood by those of ordinary skill in the art that, for the convenience of description, FIG. 8 illustrates merely one memory 50 and one processor 30. In an actual terminal device or a server, there may be multiple processors 30 and multiple memories 50. The memory 50 may also be referred to as a storage medium or a storage device, which is not limited herein.

It can be understood that, in implementations of the disclosure, the processor 30 may be a central processing unit (CPU). The processor 30 may also be a general-purpose processor, a digital signal processor (DSP), an application specific integrated circuit (ASIC), a field-programmable gate array (FPGA), or other programmable logic devices, discrete gates or transistor logic devices, discrete hardware components, etc.

It can further be understood that, the memory 50 mentioned in implementations of the disclosure may also be a volatile memory or a non-volatile memory, or may include both the volatile memory and the non-volatile memory. The non-volatile memory may be a read-only memory (ROM), a programmable ROM (PROM), an erasable PROM (EPROM), an electrically EPROM (EEPROM), or a flash memory. The volatile memory may be a random access memory (RAM) that acts as an external cache. By way of example but not limitation, many forms of RAM are available, such as a static RAME (SRAM), a dynamic RAM (DRAM), a synchronous DRAM (SDRAM), a double data rate SDRAM (DDR SDRAM), an enhanced SDRAM (ESDRAM), a synchlink DRAM (SLDRAM), and a direct rambus RAM (DR RAM).

It needs to be noted that, when the processor 30 is a general-purpose processor, a DSP, an ASIC, an FPGA, or other programmable logic devices, discrete gates or transistor logic devices, discrete hardware components, the memory is integrated in the processor.

It needs to be noted that, the memory 50 described herein is intended to include, but is not limited to, these and any other suitable types of memory.

In addition to a data bus, the bus 20 further includes a power bus, a control bus, and a status signal bus. However, for the clarity of illustration, various buses are marked as the bus 20 in figures.

It can also be understood that, the first, second, third, fourth, and various numerical numbers involved herein are only used for distinguishing for convenient illustration, and are not intended to limit the scope of the disclosure.

It can be understood that, the term "and/or" in this disclosure is simply an illustration of an association relationship of associated objects, indicating that three relationships may exist, for example, A and/or B, which may indicate the existence of A alone, A and B together, and B alone. In addition, the character "/" in this disclosure generally indicates that associated objects are in an "or" relationship.

During implementation, each operation of the foregoing method may be completed by an integrated logic circuit in the form of hardware or an instruction in the form of software in the processor 30. The operations of the method disclosed in implementations of the disclosure may be directly implemented through a hardware processor, or may be performed by hardware and software modules in the processor 30. The software module can be located in a storage medium such as an RAM 50, a flash memory, an ROM, a PROM, an electrically erasable programmable memory, a register, and the like. The storage medium is located in the memory 50. The processor 30 reads information in the memory 50, and completes the operations of the method described above with the hardware of the processor 30, which will not be illustrated in detail to avoid repetition.

In various implementations described herein, the magnitude of a sequence number of each process does not mean an order of execution, and the order of execution of each process should be determined by its function and an internal logic and shall not constitute any limitation to an implementation process of implementations.

Those of ordinary skill in the art will appreciate that illustrative logical blocks (ILB) and operations described in connection with implementations herein can be implemented by electronic hardware or by a combination of computer software and electronic hardware. Whether these functions are performed by hardware or software depends on particular application and design constraints of the technical solution. Those of ordinary skill in the art may use different methods for each particular application to implement the described function, but such methods should not be regarded as beyond the scope of the disclosure.

It can be understood that the systems, devices, and methods disclosed in implementations provided in the disclosure may also be implemented in other manners. For example, the above devices implementations are merely illustrative, e.g., the division of modules is only a division of logical functions, and there may exist other manners of division in practice, e.g., multiple modules or components may be combined or integrated into another system, or some features may be ignored or skipped. In other respects, the coupling or direct coupling or communication connection as illustrated or discussed may be an indirect coupling or communication connection through some interfaces, devices, or units, and may be electrical, mechanical, or otherwise.

The modules illustrated as separated parts may or may not be physically separated. Parts displayed as modules may or may not be physical modules, and may be located at one location or may be distributed to multiple network modules. Some or all of the modules may be selectively adopted according to practical needs to achieve the aims of the solutions of the implementation.

In addition, various functional modules described in implementations of the disclosure may be integrated into one processing module or may be presented as a number of physically separated modules, or two or more modules may be integrated into one processing module.

All or part of the above implementations can be implemented through software, hardware, firmware, or any other combination thereof. When implemented by software, all or part of the above implementations can be implemented in a form of a computer program product. The computer program product includes one or more computer instructions. When the computer program instructions are loaded and executed on a computer, all or part of the processes or functions of the implementations of the disclosure are performed. The computer may be a general-purpose computer, a special-purpose computer, a computer network, or other programmable apparatuses. The computer instructions can be stored in a computer-readable storage medium, or transmitted from one computer-readable storage medium to another computer-readable storage medium. For example, the computer instructions can be transmitted from one website, computer, server, or data center to another website, computer, server, or data center in a wired manner or in a wireless manner. Examples of the wired manner may be, for example, a coaxial cable, an optical fiber, a digital subscriber line (DSL), etc. The wireless manner may be, for example, infrared, wireless, microwave, etc. The computer-readable storage medium may be any computer accessible usable-medium or a data storage device such as a server, a data center, or the like which is integrated with one or more usable media. The usable medium may be a magnetic medium (such as a soft disc, a hard disc, or a magnetic tape), an optical medium (such as a digital video disc (DVD)), or a semiconductor medium (such as a solid state disk (SSD)), etc.

The above are some implementations of the disclosure, and it should be noted that, for those of ordinary skill in the art, any improvement and modification made without departing from the principle of the disclosure shall also belong to the scope of protection of the disclosure.

What is claimed is:

1. A method for predicting a life of a battery, the method being executed by an electricity-consumption device and comprising:
    obtaining a plurality of cycle numbers of the battery and a plurality of capacity data corresponding to the plurality of cycle numbers, wherein the plurality of cycle numbers are a plurality of cycle numbers of the battery at a plurality of time nodes in a previous time period;
    obtaining a plurality of sets of first fitting data by fitting the plurality of cycle numbers and the plurality of capacity data with a bi-exponential empirical model;
    obtaining a plurality of sets of second fitting data by fitting the plurality of cycle numbers and the plurality of capacity data with a box-cox transformation method;
    determining a first capacity error corresponding to the plurality of cycle numbers according to the plurality of sets of first fitting data and the plurality of capacity data;
    determining a second capacity error corresponding to the plurality of cycle numbers according to the plurality of sets of second fitting data and the plurality of capacity data;
    generating a battery-life prediction model according to the first capacity error, the second capacity error, the plurality of sets of first fitting data, and the plurality of sets of second fitting data; and
    determining a remaining useful life (RUL) of the battery according to a predetermined battery-capacity-value and the battery-life prediction model.

2. The method for predicting a life of claim 1, wherein each of the plurality of sets of first fitting data comprises a first fitting-capacity-value, and wherein determining the first capacity error corresponding to the plurality of cycle numbers according to the plurality of sets of first fitting data and the plurality of capacity data comprises:
    calculating a first difference value between each first fitting-capacity-value and each capacity data that correspond to each of the plurality of cycle numbers to obtain a plurality of first difference values;
    obtaining a sum of squares of the first difference values corresponding to the plurality of cycle numbers by summing the squares of the first difference values; and
    obtaining the first capacity error by extracting a square root of the sum of the squares of the first difference values.

3. The method for predicting a life of claim 1, wherein each of the plurality of sets of second fitting data comprises a second fitting-capacity-value, and wherein determining the second capacity error corresponding to the plurality of cycle numbers according to the plurality of sets of second fitting data and the plurality of capacity data comprises:
    calculating a second difference value between each second fitting-capacity-value and each capacity data that correspond to each of the plurality of cycle numbers to obtain a plurality of second difference values;
    obtaining a sum of squares of the second difference values corresponding to the plurality of cycle numbers by summing the squares of the second difference values; and
    obtaining the second capacity error by extracting a square root of the sum of the squares of the second difference values.

4. The method for predicting a life of claim 1, wherein the plurality of sets of first fitting data comprise a plurality of first fitting-capacity-values and a plurality of first fitting-cycle-numbers corresponding to the plurality of first fitting-capacity-values, and the plurality of sets of second fitting data comprise a plurality of second fitting-capacity-values, and wherein generating the battery-life prediction model according to the first capacity error, the second capacity error, the plurality of sets of first fitting data, and the plurality of sets of second fitting data comprises:
    when a ratio of the first capacity error to the second capacity error is less than a preset threshold, generating the battery-life prediction model according to the first capacity error, the second capacity error, the plurality of first fitting-capacity-values, and the plurality of second fitting-capacity-values; or
    when the ratio of the first capacity error to the second capacity error is greater than or equal to the preset threshold, obtaining a fitting-failure-cycle-number in the plurality of first fitting-cycle-numbers, and generating the battery-life prediction model according to the fitting-failure-cycle-number and a cubic polynomial algorithm.

5. The method for predicting a life of claim 4, wherein when the ratio of the first capacity error to the second capacity error is less than the preset threshold, generating the battery-life prediction model according to the first capacity error, the second capacity error, the plurality of first fitting-capacity-values, and the plurality of second fitting-capacity-values comprises:
    determining a sum of the first capacity error and the second capacity error as a first numerical value;
    obtaining a ratio of the first capacity error to the first numerical value and determining the ratio of the first capacity error to the first numerical value as a first weight value;
    obtaining a ratio of the second capacity error to the first numerical value and determining the ratio of the second capacity error to the first numerical value as a second weight value; and
    generating the battery-life prediction model according to a sum of a product of each of the plurality of first fitting-capacity-values and the first weight value and a product of each of the plurality of second fitting-capacity-values and the second weight value.

6. The method for predicting a life of claim 4, wherein when the ratio of the first capacity error to the second capacity error is greater than or equal to the preset threshold, obtaining the fitting-failure-cycle-number in the plurality of sets of first fitting-cycle-numbers, and generating the battery-life prediction model according to the fitting-failure-cycle-number and the cubic polynomial algorithm, comprise:

determining a plurality of first fitting-capacity-values corresponding to first fitting-cycle-numbers arranged before the fitting-failure-cycle-number of the battery in the plurality of first fitting-cycle-numbers as a plurality of valid capacity values; and generating the battery-life prediction model according to the plurality of valid capacity values and the cubic polynomial algorithm.

7. The method for predicting a life of claim 1, wherein determining the RUL of the battery according to the predetermined battery-capacity-value and the battery-life prediction model comprises:

determining, according to the battery-life prediction model, a predicted failure-cycle-number corresponding to a case where a capacity value of the battery reaches the predetermined battery-capacity-value;

determining a current cycle number of the battery;

calculating a cycle-number difference value between the predicted failure-cycle-number and the current cycle number; and determining the RUL of the battery according to the cycle-number difference value.

8. An electricity-consumption device, comprising a processor and a memory, wherein the processor is coupled with the memory, and the memory is configured to store computer programs which comprise program instructions, wherein the processor is configured to invoke the program instructions to:

obtain a plurality of cycle numbers of the battery and a plurality of capacity data corresponding to the plurality of cycle numbers, wherein the plurality of cycle numbers are a plurality of cycle numbers of the battery at a plurality of time nodes in a previous time period;

obtain a plurality of sets of first fitting data by fitting the plurality of cycle numbers and the plurality of capacity data with a bi-exponential empirical model;

obtain a plurality of sets of second fitting data by fitting the plurality of cycle numbers and the plurality of capacity data with a box-cox transformation method;

determine a first capacity error corresponding to the plurality of cycle numbers according to the plurality of sets of first fitting data and the plurality of capacity data;

determine a second capacity error corresponding to the plurality of cycle numbers according to the plurality of sets of second fitting data and the plurality of capacity data;

generate a battery-life prediction model according to the first capacity error, the second capacity error, the plurality of sets of first fitting data, and the plurality of sets of second fitting data; and determine a remaining useful life (RUL) of the battery according to a predetermined battery-capacity-value and the battery-life prediction model.

9. The electricity-consumption device of claim 8, wherein each of the plurality of sets of first fitting data comprises a first fitting-capacity-value, and the program instructions executed by the processor to cause the processor to determine the first capacity error corresponding to the plurality of cycle numbers causes the processor to:

calculate a first difference value between each first fitting-capacity-value and each capacity data that correspond to each of the plurality of cycle numbers to obtain a plurality of first difference values;

obtain a sum of squares of the first difference values corresponding to the plurality of cycle numbers by summing the squares of the first difference values; and obtain the first capacity error by extracting a square root of the sum of the squares of the first difference values.

10. The electricity-consumption device of claim 8, wherein each of the plurality of sets of second fitting data comprises a second fitting-capacity-value, and wherein the program instructions executed by the processor to determine the second capacity error corresponding to the plurality of cycle numbers causes the processor to:

calculate a second difference value between each second fitting-capacity-value and each capacity data that correspond to each of the plurality of cycle numbers to obtain a plurality of second difference values;

obtain a sum of squares of the second difference values corresponding to the plurality of cycle numbers by summing the squares of the second difference values; and obtain the second capacity error by extracting a square root of the sum of the squares of the second difference values.

11. The electricity-consumption device of claim 8, wherein the plurality of sets of first fitting data comprise a plurality of first fitting-capacity-values and a plurality of first fitting-cycle-numbers corresponding to the plurality of first fitting-capacity-values, and the plurality of sets of second fitting data comprise a plurality of second fitting-capacity-values, and wherein the program instructions executed by the processor to cause the processor to generate the battery-life prediction model causes the processor to:

generate the battery-life prediction model according to the first capacity error, the second capacity error, the plurality of first fitting-capacity-values, and the plurality of second fitting-capacity-values, when a ratio of the first capacity error to the second capacity error is less than a preset threshold; or obtain a fitting-failure-cycle-number in the plurality of first fitting-cycle-numbers, and generate the battery-life prediction model according to the fitting-failure-cycle-number and a cubic polynomial algorithm, when the ratio of the first capacity error to the second capacity error is greater than or equal to the preset threshold.

12. The electricity-consumption device of claim 11, wherein the program instructions executed by the processor to generate the battery-life prediction model causes the processor to:

determine a sum of the first capacity error and the second capacity error as a first numerical value;

obtain a ratio of the first capacity error to the first numerical value and determine the ratio of the first capacity error to the first numerical value as a first weight value;

obtain a ratio of the second capacity error to the first numerical value and determine the ratio of the second capacity error to the first numerical value as a second weight value; and generate the battery-life prediction model according to a sum of a product of each of the plurality of first fitting-capacity-values and the first weight value and a product of each of the plurality of second fitting-capacity-values and the second weight value.

13. The electricity-consumption device of claim 11, wherein the program instructions executed by the processor to cause the processor to obtain the fitting-failure-cycle-number in the plurality of sets of first fitting-cycle-numbers and generate the battery-life prediction model causes the processor to:

determine a plurality of first fitting-capacity-values corresponding to first fitting-cycle-numbers arranged before the fitting-failure-cycle-number of the battery in the plurality of first fitting-cycle-numbers as a plurality of valid capacity values; and generate the battery-life prediction model according to the plurality of valid capacity values and the cubic polynomial algorithm.

14. The electricity-consumption device of claim 8, wherein the program instructions executed by the processor to cause the processor to determine the RUL of the battery causes the processor to:

determine, according to the battery-life prediction model, a predicted failure-cycle-number corresponding to a case where a capacity value of the battery reaches the predetermined battery-capacity-value;

determine a current cycle number of the battery;

calculate a cycle-number difference value between the predicted failure-cycle-number and the current cycle number; and determine the RUL of the battery according to the cycle-number difference value.

15. A non-transitory computer-readable storage medium configured to store computer programs, wherein the computer programs comprise program instructions which are executed by a processor to:

obtain a plurality of cycle numbers of a battery and a plurality of capacity data corresponding to the plurality of cycle numbers, wherein the plurality of cycle numbers are a plurality of cycle numbers of the battery at a plurality of time nodes in a previous time period;

obtain a plurality of sets of first fitting data by fitting the plurality of cycle numbers and the plurality of capacity data with a bi-exponential empirical model;

obtain a plurality of sets of second fitting data by fitting the plurality of cycle numbers and the plurality of capacity data with a box-cox transformation method;

determine a first capacity error corresponding to the plurality of cycle numbers according to the plurality of sets of first fitting data and the plurality of capacity data;

determine a second capacity error corresponding to the plurality of cycle numbers according to the plurality of sets of second fitting data and the plurality of capacity data;

generate a battery-life prediction model according to the first capacity error, the second capacity error, the plurality of sets of first fitting data, and the plurality of sets of second fitting data; and determine a remaining useful life (RUL) of the battery according to a predetermined battery-capacity-value and the battery-life prediction model.

16. The non-transitory computer-readable storage medium of claim 15, wherein each of the plurality of sets of first fitting data comprises a first fitting-capacity-value, and the program instructions executed by the processor to determine the first capacity error corresponding to the plurality of cycle numbers are executed by the processor to:

calculate a first difference value between each first fitting-capacity-value and each capacity data that correspond to each of the plurality of cycle numbers to obtain a plurality of first difference values;

obtain a sum of squares of the first difference values corresponding to the plurality of cycle numbers by summing the squares of the first difference values; and obtain the first capacity error by extracting a square root of the sum of the squares of the first difference values.

17. The non-transitory computer-readable storage medium of claim 15, wherein each of the plurality of sets of second fitting data comprises a second fitting-capacity-value, and wherein the program instructions executed by the processor to determine the second capacity error corresponding to the plurality of cycle numbers are executed by the processor to:

calculate a second difference value between each second fitting-capacity-value and each capacity data that correspond to each of the plurality of cycle numbers to obtain a plurality of second difference values;

obtain a sum of squares of the second difference values corresponding to the plurality of cycle numbers by summing the squares of the second difference values; and obtain the second capacity error by extracting a square root of the sum of the squares of the second difference values.

18. The non-transitory computer-readable storage medium of claim 15, wherein the plurality of sets of first fitting data comprise a plurality of first fitting-capacity-values and a plurality of first fitting-cycle-numbers corresponding to the plurality of first fitting-capacity-values, and the plurality of sets of second fitting data comprise a plurality of second fitting-capacity-values, and wherein the program instructions executed by the processor to cause the processor to generate the battery-life prediction model are executed by the processor to:

generate the battery-life prediction model according to the first capacity error, the second capacity error, the plurality of first fitting-capacity-values, and the plurality of second fitting-capacity-values, when a ratio of the first capacity error to the second capacity error is less than a preset threshold; or obtain a fitting-failure-cycle-number in the plurality of first fitting-cycle-numbers, and generate the battery-life prediction model according to the fitting-failure-cycle-number and a cubic polynomial algorithm, when the ratio of the first capacity error to the second capacity error is greater than or equal to the preset threshold.

19. The non-transitory computer-readable storage medium of claim 18, wherein the program instructions executed by the processor to cause the processor to generate the battery-life prediction model are executed by the processor to:

determine a sum of the first capacity error and the second capacity error as a first numerical value;

obtain a ratio of the first capacity error to the first numerical value and determine the ratio of the first capacity error to the first numerical value as a first weight value;

obtain a ratio of the second capacity error to the first numerical value and determine the ratio of the second capacity error to the first numerical value as a second weight value; and generate the battery-life prediction model according to a sum of a product of each of the plurality of first fitting-capacity-values and the first weight value and a product of each of the plurality of second fitting-capacity-values and the second weight value.

20. The non-transitory computer-readable storage medium of claim 18, wherein the program instructions executed by the processor to cause the processor to obtain the fitting-failure-cycle-number in the plurality of sets of first fitting-cycle numbers and generate the battery-life prediction model causes the processor to:

determine a plurality of first fitting-capacity-values corresponding to first fitting-cycle-numbers arranged before the fitting-failure-cycle-number of the battery in the plurality of first fitting-cycle-numbers as a plurality of valid capacity values; and generate the battery-life prediction model according to the plurality of valid capacity values and the cubic polynomial algorithm.

* * * * *